(12) United States Patent
Steger

(10) Patent No.: US 6,896,765 B2
(45) Date of Patent: May 24, 2005

(54) METHOD AND APPARATUS FOR THE COMPENSATION OF EDGE RING WEAR IN A PLASMA PROCESSING CHAMBER

(75) Inventor: Robert J. Steger, Los Altos, CA (US)

(73) Assignee: Lam Research Corporation, Fremont, CA (US)

(*) Notice: Subject to any disclaimer, the term of this patent is extended or adjusted under 35 U.S.C. 154(b) by 62 days.

(21) Appl. No.: 10/247,812

(22) Filed: Sep. 18, 2002

(65) Prior Publication Data

US 2004/0053428 A1 Mar. 18, 2004

(51) Int. Cl.$^7$ ............................................. H01L 21/306
(52) U.S. Cl. ................... 156/345.51; 118/728
(58) Field of Search ..................... 156/345.51; 118/728; 361/234; 250/281

(56) References Cited

U.S. PATENT DOCUMENTS 5,252,827 A  * 10/1993 Koga et al. ................. 250/281
6,074,488 A  *  6/2000 Roderick et al. ........... 118/728
6,475,336 B1 * 11/2002 Hubacek ................. 156/345.51

* cited by examiner

Primary Examiner—John F. Niebling
Assistant Examiner—Andre' C. Stevenson
(74) Attorney, Agent, or Firm—IP Strategy Group PC

(57) ABSTRACT

A method for processing a plurality of substrates in a plasma processing chamber of a plasma processing system, each of the substrate being disposed on a chuck and surrounded by an edge ring during the processing. The method includes processing a first substrate of the plurality of substrates in accordance to a given process recipe in the plasma processing chamber. The method further includes adjusting, thereafter, a capacitance value of a capacitance along a capacitive path between a plasma sheath in the plasma processing chamber and the chuck through the edge ring by a given value. The method additionally includes processing a second substrate of the plurality of substrates in accordance to the given process recipe in the plasma processing chamber after the adjusting, wherein the adjusting is performed without requiring a change in the edge ring.

15 Claims, 7 Drawing Sheets

METHOD AND APPARATUS FOR THE COMPENSATION OF EDGE RING WEAR IN A PLASMA PROCESSING CHAMBER

BACKGROUND OF THE INVENTION

The present invention relates in general to substrate manufacturing technologies and in particular to methods and apparatus for improving process results by compensating for edge ring wear in a plasma processing chamber.

In the processing of a substrate, e.g., a semiconductor wafer or a glass panel such as one used in flat panel display manufacturing, plasma is often employed.

As part of the processing of a semiconductor wafer, for example, the wafer is divided into a plurality of dies, or rectangular areas, each of which will become an integrated circuit. The wafer is processed in a series of steps in which materials are selectively removed (etching) and deposited (deposition) in order to form electrical components thereon.

In an exemplary plasma etching process, the wafer is coated with a thin film of hardened emulsion (i.e., such as a photoresist mask) prior to etching. Areas of the hardened emulsion are then selectively removed, causing parts of the underlying layer to become exposed. The wafer is then placed in a plasma processing chamber on a negatively charged electrode, called a chuck. Appropriate etchant source gases are then flowed into the chamber and struck to form a plasma to etch exposed areas of the underlying layer(s). In an exemplary plasma deposition process, plasma is also employed to facilitate and/or improve deposition from the source deposition materials.

In many plasma processing chambers, an edge ring is often employed. To facilitate discussion, FIG. 1 illustrates a simplified cross section view of a plasma processing chamber 100. A wafer 104 sits on a chuck 112 which supports the wafer in the plasma processing chamber. Chuck 112 acts as a work piece holder and may be electrically energized by an RF power source to facilitate etching and deposition, as is well known. A coupling ring 108 is shown disposed between chuck 112 and a ceramic ring 110. One of the functions of coupling ring 108 includes providing a current path from chuck 112 to an edge ring 102. Edge ring 102 performs many functions, including positioning wafer 104 on chuck 112 and shielding the underlying components not protected by the wafer itself from being damaged by the ions of the plasma.

One important function of edge ring 112 relates to its effect on process uniformity across the substrate. It is well known that the equipotential lines of the plasma sheath 106 curve upward sharply past the edge of the chuck. Without an edge ring, the substrate edge electrically defines the outer edge of the chuck, and the equipotential lines would curve upward sharply in the vicinity of the substrate edge. As such, areas of the substrate around the substrate edge would experience a different plasma environment from the plasma environment that exists at the center of substrate, thereby contributing to poor process uniformity across the substrate surface.

By electrically extending the plasma-facing area of the chuck with an edge ring and/or other underlying structures, the edge of the chuck appears electrically to the plasma to extend some distance outside of the edge of the substrate. Thus, the equipotential lines of the plasma sheath stays more constant over the entire surface of the substrate, thereby contributing to process uniformity across the substrate surface.

Unfortunately, edge rings tend to be worn away over time by the plasma environment. As the edge ring wears away, the plasma environment in the vicinity of the damaged regions of the edge ring changes. The change to the plasma in turn causes the process result to change over time, and contributes to process degradation as the edge ring wears away. This is the case even if the process employs the same recipe in the same chamber time after time.

Over time, the process result degrades to the point where an edge ring change is necessary. When an edge ring change is required, substrate processing is brought to a halt, and the plasma processing chamber is taken out of service in order to facilitate an edge ring change. During the edge ring change operation, which may take hours or days, the manufacturer is deprived of the use of the affected plasma processing system, which contributes to a higher cost of ownership for the plasma processing system.

In view of the foregoing, there are desired improved methods and apparatus for improving process results in a plasma processing system that employs edge rings, as well as for reducing the frequency with which an edge ring change is required.

SUMMARY OF THE INVENTION

The invention relates, in one embodiment, to a method for processing a plurality of substrates in a plasma processing chamber of a plasma processing system, each of the substrate being disposed on a chuck and surrounded by an edge ring during the processing. The method includes processing a first substrate of the plurality of substrates in accordance to a given process recipe in the plasma processing chamber. The method further includes adjusting, thereafter, a capacitance value of a capacitance along a capacitive path between a plasma sheath in the plasma processing chamber and the chuck through the edge ring by a given value. The method additionally includes processing a second substrate of the plurality of substrates in accordance to the given process recipe in the plasma processing chamber after the adjusting, wherein the adjusting is performed without requiring a change in the edge ring.

In another embodiment, the invention relates to a plasma processing system having at least one plasma processing chamber for processing a plurality of substrates. The plasma processing chamber includes a chuck configured for supporting a substrate during the processing and an edge ring having an outer periphery. The outer periphery of the edge ring surrounds the chuck, wherein the edge ring is disposed along a capacitive path between a plasma sheath and the chuck during the processing, the plasma sheath being associated with a plasma generated during the processing. The plasma processing chamber additionally includes an arrangement for adjusting in-situ a capacitance value of a capacitance disposed along the capacitive path.

In yet another embodiment, the invention relates to a plasma processing system having at least one plasma processing chamber for processing a plurality of substrates. The plasma processing chamber includes supporting means for supporting a substrate during the processing. There is further included an edge ring having an outer periphery, the outer periphery of the edge ring surrounding the supporting means, wherein the edge ring is disposed along a capacitive path between a plasma sheath and the supporting means during the processing, the plasma sheath being associated with a plasma generated during the processing. Additionally, there is included means for adjusting in-situ a capacitance value of a capacitance disposed along the capacitive path.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

While not wishing to be bound by theory, it is believed by the inventor herein that when the edge ring is worn away, the capacitance along the capacitive path from the plasma sheath to the chuck through the edge ring changes. The change in the capacitance in turn affects the plasma environment in the vicinity of the damaged regions of the edge ring. Unless this change in capacitance is compensated for as the edge ring wears away, process degradation is inevitable. Furthermore, without compensating for the change in capacitance as the edge ring wears away, the process degradation is uncorrected and necessitates more frequent edge ring changes.

Figure 1:
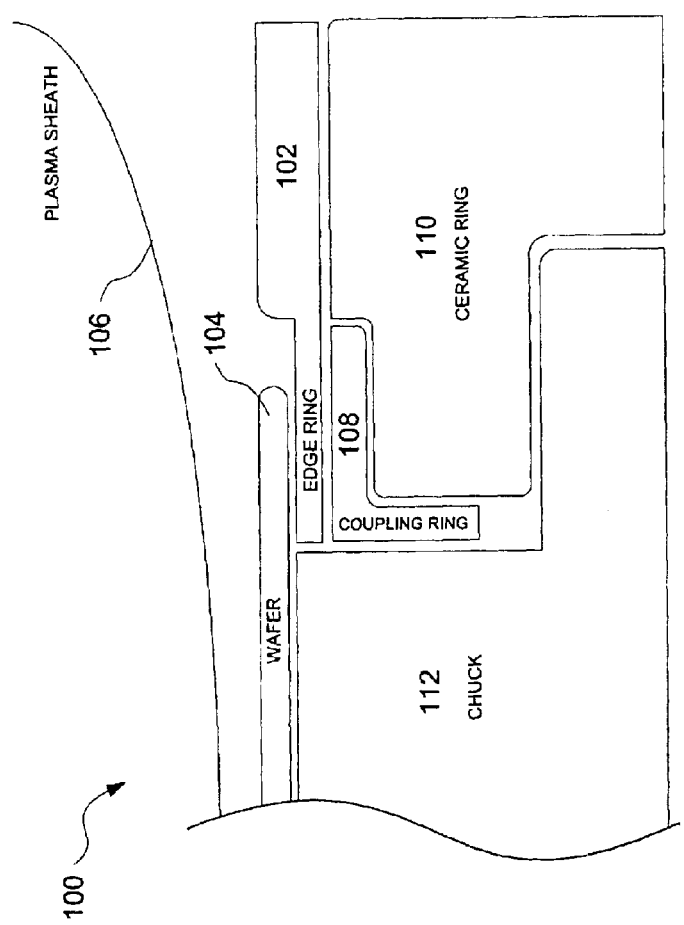
FIG. 1 depicts a simplified cross section view of a plasma processing chamber.
Figure 2A:
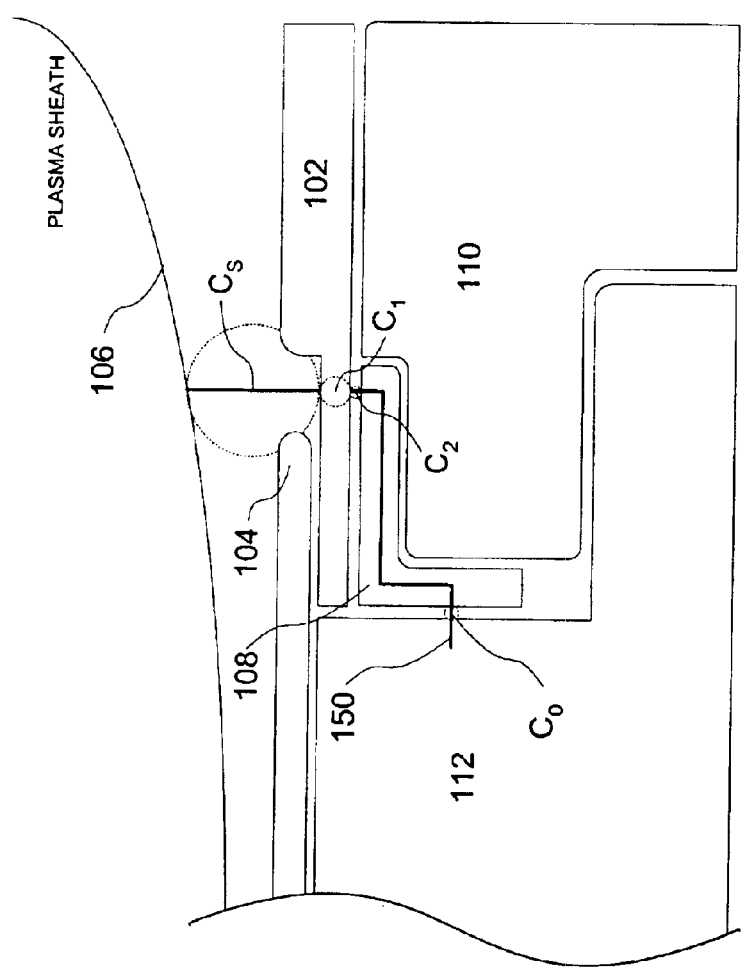
FIG. 2A depicts a simplified cross section view of a plasma processing chamber according to an embodiment of the invention.

To facilitate discussion, FIG. 2A illustrates another plasma processing chamber diagram is which the capacitive path 150 from plasma sheath 106 to chuck 112 through edge ring 102 is depicted. Referring now to FIG. 2A, plasma sheath 106, wafer 104, chuck 112, coupling ring 108, edge ring 102, and ceramic ring 110 are as shown in FIG. 1. Beginning at the conducting surface of chuck 112, there is shown an equivalent capacitance C0, which is defined by the surface of chuck 112, the surface of coupling ring 108, and the space in between. Along the capacitive path 150, there is another equivalent capacitance 2 which is defined by the surfaces of coupling ring 108 and the lower face of edge ring 102 and the space in between. Further along the capacitive path 150, the dielectric material in edge ring 102 forms another capacitance C1. Additionally, the gap between plasma sheath 106 and the upper surface of edge ring 102 forms another capacitance Cs along capacitive path 150.

Figure 2B:
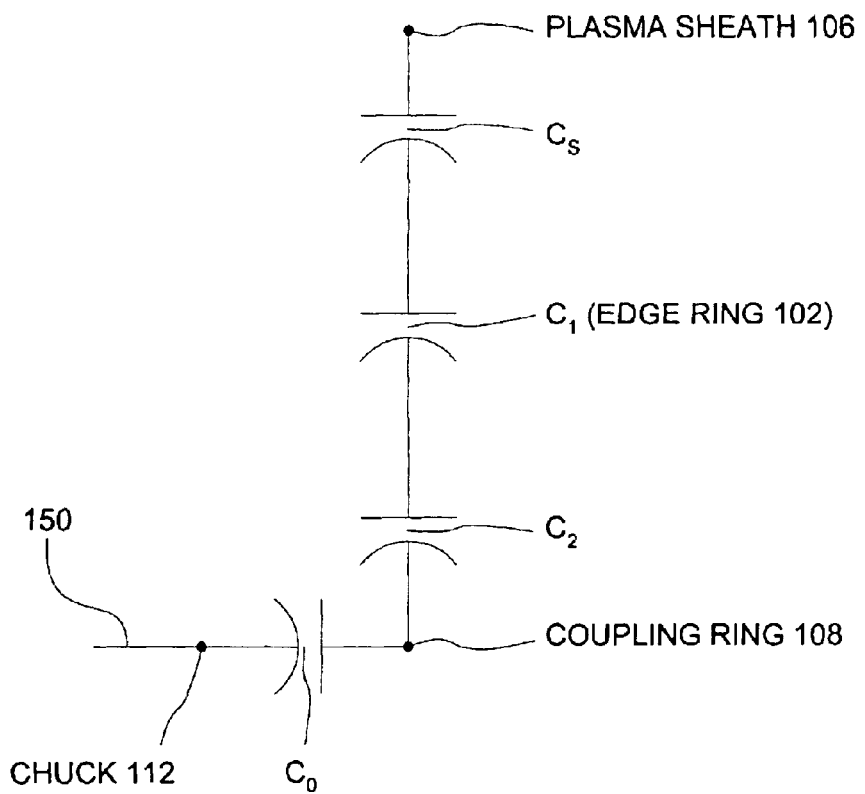
FIG. 2B depicts a simplified electrical diagram for a capacitive path according to an embodiment of the invention.

Referring now to FIG. 2B, a simplified electrical diagram for capacitive path 150 is shown. Chuck 112 is electrically coupled in series with capacitance C0, which is shown disposed between chuck 112 and coupling ring 108. Capacitance C2 is coupled in series along the capacitive path 150 between coupling ring 108 and the lower face of edge ring 102. Capacitance 1 which is formed by the dielectric material of edge ring 102 is shown coupled in series with capacitance C2. Capacitance Cs completes the capacitive path 150 by coupling in series with capacitance C2 between capacitance C2 and plasma sheath 106.

When the edge ring is worn away and/or damaged by the plasma, the capacitance C1 attributable to the dielectric material of the edge ring changes. The change in capacitance C1 in turn affects the plasma environment in the vicinity of the damaged regions of the edge ring. As the plasma environment changes, process result degrades.

Figure 3A:
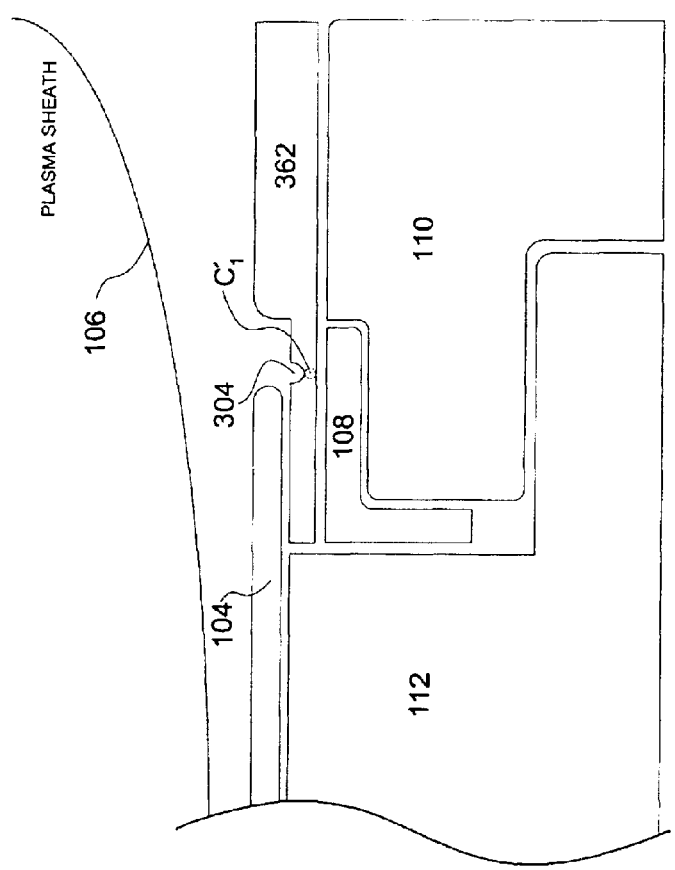
FIG. 3A depicts a simplified cross section view of a plasma processing chamber according to an embodiment of the invention.
Figure 3B:
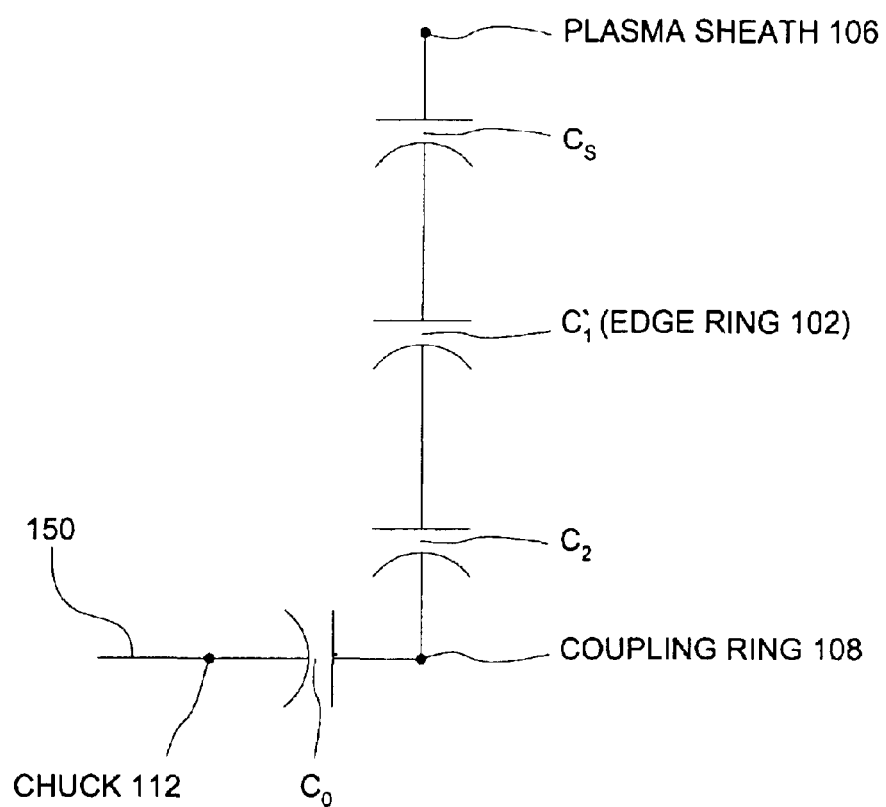
FIG. 3B depicts a simplified electrical diagram for a capacitive path according to an embodiment of the invention.

FIG. 3A illustrates a simplified cross section view of the plasma processing chamber of FIG. 2A, including an exemplary damaged region 304 in edge ring 102. It is believed that damaged region 304, which may take the form of a trench, cavity, or pit in edge ring 102 alters the aforementioned capacitance C1 in the vicinity of the damaged region. The changed capacitive path is shown in FIG. 3B. In contrast to the situation in FIG. 2B, the value of the capacitance C1' attributable to the damaged dielectric material in edge ring 102 is larger due to the thinning of the dielectric material (since $C=\epsilon A/d$). This increase in the value of capacitance C1 in turn increases the total capacitance along capacitive path 150, contributing to a reduction in the impedance along path 150 (since $Z=1/\omega C$ or $Z=d/\epsilon A\omega$). As the impedance along the path from the plasma sheath to the chuck decreases, the current along path 150 increases. This increase in the current between the plasma sheath and the chuck through the damaged regions of the edge ring coincides with an increase in the etch rate at the edge of the substrate, relative to other regions of the substrate. In addition, the features etched in the edge areas of the substrate show more tilt towards the substrate perimeter as the edge ring erosion progresses. Ideally, there would be no change in substrate edge etch rate and no tilting of the etched features over time. Also, the edge ring would either not erode or erode at a slow rate which would allow the etcher to remain in service until some later service interval was reached. Some semiconductor manufacturing processes cannot tolerate the etching characteristics changing more than a very small amount, and as such the edge ring lifetime is shortened more so than by the mere loss of material. It is the purpose of this invention to effectively extend the service life of the edge ring by compensating for the erosion so as to minimize the substrate edge etch rate change and feature tilt effects with time.

In accordance with one aspect of the present invention, the change in the capacitance along capacitive path 150 attributable to edge ring damage is compensated for by reducing the capacitance of one or more of capacitances C0, C2 or CS. In a preferred embodiment, the increase in capacitance C1 due to edge ring thinning damage is offset by decreasing the capacitance C2 associated with the gap between the lower surface of the edge ring and the coupling ring. In one embodiment, decreasing the capacitance C2 is accomplished by providing a mechanism that can move the edge ring and the coupling ring further apart to decrease the capacitance C2 in between to compensate for the increased capacitance C1 caused by edge ring thinning damage.

Figure 4A:
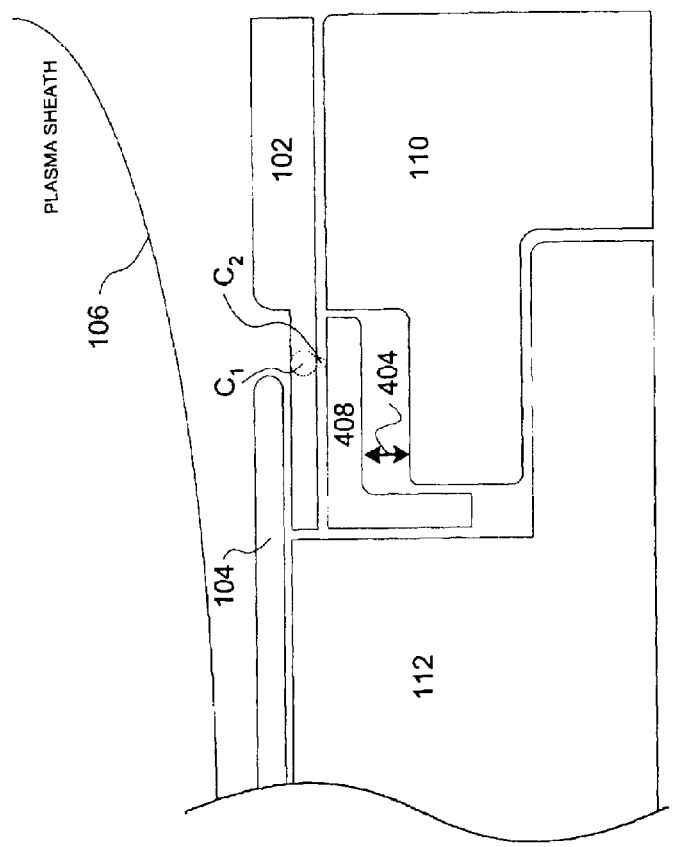
FIG. 4A depicts a simplified cross section view of a plasma processing chamber according to an embodiment of the invention; and, FIG. 4B depicts a simplified electrical diagram for a capacitive path according to an embodiment of the invention.
Figure 4B:
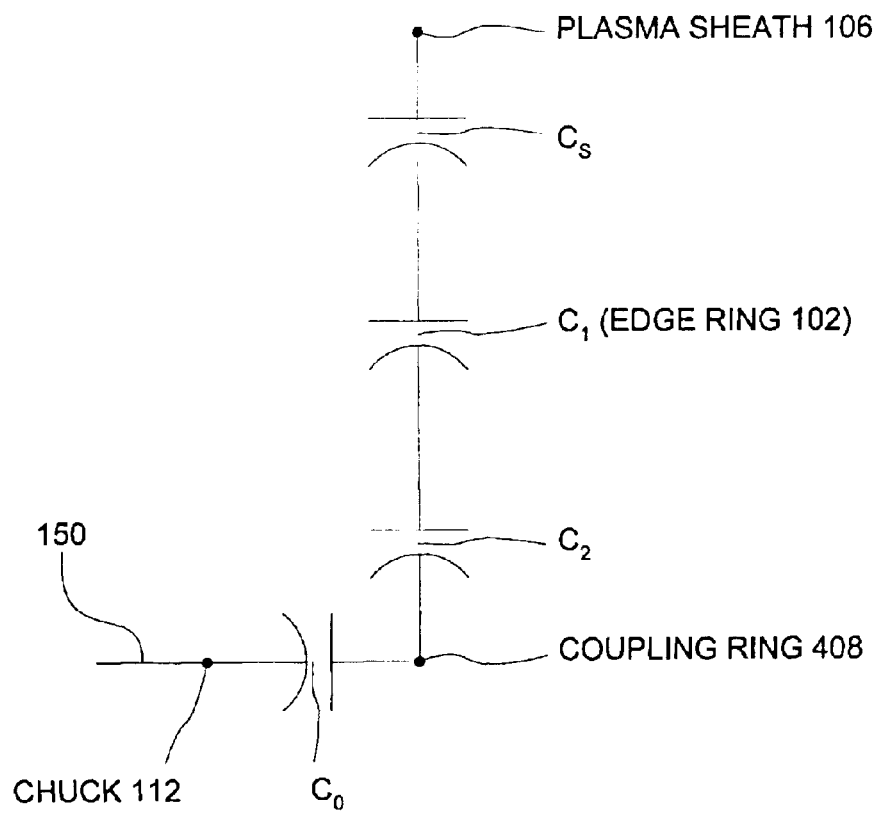

FIG. 4A illustrates, in accordance with one embodiment of the present invention, a simplified cross section view of a plasma processing chamber with a variable position coupling ring 408. Referring now to FIG. 4A, variable position coupling ring 408 is configured to travel along a path 404. Since the capacitance value of capacitance C2 is dependent upon the distance between lower surface of edge ring 102 and variable position coupling ring 408, changing the position of variable position edge ring 408 will change the capacitance value of capacitance C2.

By using a variable position coupling ring, the increase in the capacitance C1 associated with damaged edge ring 102 can now be offset by changing the capacitance C2 through the repositioning of variable position coupling ring 408 along path 404. The net result is that the total capacitance along capacitance path 150 stays substantially the same, or is changed to a lesser extent. Since the capacitance between the plasma sheath and the chuck remains substantially unchanged or is changed to a lesser extent with the use of a variable position coupling ring, the impedance between the plasma sheath and the chuck stays substantially unchanged or is changed to a lesser extent as the edge ring wears away. This in turn helps keep the plasma environment in the vicinity of the damaged regions of the edge ring substantially unchanged or is changed to a lesser extent as the edge ring wears away.

Furthermore, the use of a variable position coupling ring delays the need to change the edge ring. As the edge ring wears away, the coupling ring is repositioned to correct for process degradation. A point will still be reached at which edge ring 102 will need to be replaced because of extensive structural damage or because the increase in the capacitance C1 due to edge ring damage cannot be adequately compensated beyond some point by further decreasing one of the other capacitances. However, replacement will occur less frequently than in the prior art, thereby reducing both costly manufacturing down time as well as the need for equipment recalibration necessitated by the replacement process.

In one embodiment, the amount of edge ring thinning or damage may be empirically determined for a particular process in a particular plasma processing chamber by measuring the edge ring thickness over time. For example, the thickness of the edge ring in the affected regions may be measured using a contact probe, in one embodiment. Once the amount of edge ring thinning is determined as a function of time or as a function of the number of substrates processed, the capacitance value C1 as a function of time or as a function of the number of substrates processed may be determined. This information may be used to determine the required decrease in capacitance, as a function of time or as a function of the number of substrates processed, in one or more of the other capacitances along the capacitive path between the plasma sheath and the chuck in order to offset the increase in the capacitance caused by edge ring thinning damage. In the variable position coupling ring case, this information may in turn be employed to calculate the required gap during production runs between the coupling ring and the edge ring, as a function of time or as a function of the number of substrates processed, to satisfactorily offset the increase in the capacitance caused by edge ring thinning damage.

In another embodiment, the decrease in the capacitance value of one or more of the other capacitances along the capacitive path between the plasma sheath and the chuck may be computed, either theoretically or via computer-assisted modeling taken into account, among others, the materials of the various components of the plasma processing chamber, the geometry of the chamber and its components, and the process recipe. This information may then be employed to reduce the capacitance of one or more of the other capacitances along the capacitive path between the plasma sheath and the chuck in the production chamber.

Reducing the capacitance value of one or more of the other capacitances along the capacitive path between the plasma sheath and the chuck through the edge ring may be accomplished in various ways. In the case of a variable position coupling ring, for example, one or more linear or screw actuators may be provided to physically move variable position coupling ring 408 relative to the edge ring. The actuator(s) may be anchored against chuck 112 or ceramic ring 110 or even edge ring 102 if desired.

Additionally, it is contemplated that the edge ring may alternately or additionally be made movable to compensate for the increase in the capacitance C1 attributable to edge ring thinning damage. Still further, it is possible to keep the coupling and edge rings stationary and provide movable inserts, which can be positioned as needed in the gaps between the chuck and the coupling ring, or in between the coupling ring and the edge ring, or in between the edge ring and the plasma sheath, to offset the increase in the capacitance C1 attributable to edge ring thinning damage.

In any case, it is preferable that the capacitance adjustment be performed in-situ. That is, it is preferable that there be a mechanism provided with the plasma processing chamber to allow the capacitance of one or more of the other capacitances along the capacitive path between the plasma sheath and the chuck to be adjusted without the need to remove the plasma processing chamber from service on the production line for an extended period of time. The actuator coupled to the variable position coupling ring is but one example of this type of in-situ capacitance adjustment mechanism to offset the increase in the capacitance C1 attributable to edge ring thinning damage. As a further example, the coupling ring may be made stationary but may have a variable impedance to the chuck through the use of a variable impedance device, such as a variable capacitor. In this case, the adjustment may be made by adjusting the value of the variable impedance device as necessary to offset the change in the capacitance of the edge ring.

It should also be understood that some chamber designs may include fewer or a greater number of components in the capacitive path between the plasma sheath and the chuck through the edge ring. Irrespective of the number of components (such as rings or any other structures) involved, as long as one or more of the other capacitances along the capacitive path between the plasma sheath and the chuck body can be reduced to offset the increase in the capacitance C1 attributable to edge ring thinning damage, process degradation is reduced and the edge ring can be employed for a longer period of time before requiring a replacement.

While this invention has been described in terms of several preferred embodiments, there are alterations, permutations, and equivalents which fall within the scope of this invention. For example, although the drawings are described in the context of an etching application, it should be understood that the invention also applies to deposition processes. In the case of a deposition process, or even for certain etch processes, the deposition of material on the edge ring may decrease the capacitance of the edge ring along the aforementioned capacitive path between the plasma sheath and the chuck body, and in some cases, require an adjustment that increases the capacitance elsewhere along the capacitive path to compensate. In this case, the amount of deposition over time may be empirically determined to ascertain the change in the capacitance of the edge ring due to the deposition, or the change in the capacitance of the edge ring may be modeled or mathematically computed. This information may then be employed to facilitate compensation by adjusting one or more capacitances along the aforementioned capacitive path.

Furthermore, it is not necessary that the invention be limited to any particular type of plasma generation technology. Accordingly, it is contemplated that the invention applies to any and all plasma processing systems that experience process degradation due to edge ring thinning damage or the buildup of material on the edge ring, irrespective of how the plasma is generated, including inductively coupled plasma processing systems, capacitively coupled plasma processing systems, and others. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system having at least one plasma processing chamber for processing a plurality of substrates, said plasma processing chamber comprising:
   a chuck configured for supporting a substrate during said processing;
   an edge ring having an outer periphery, said outer periphery of said edge ring surrounding said chuck, wherein said edge ring is disposed along a capacitive path between a plasma sheath and said chuck during said processing, said plasma sheath being associated with a plasma generated during said processing;
   a coupling ring disposed along said capacitive path; and,
   an arrangement for adjusting a capacitance value of a capacitance disposed along said capacitive path, said adjusting comprises moving, along an axis that is substantially perpendicular to a surface of said edge ring, one of said edge ring and said coupling ring to adjust a gap between adjacent surfaces, said adjacent surfaces including a said surface of said edge ring and a surface of said coupling ring.

2. The plasma processing system of claim 1 wherein said arrangement is coupled to said coupling ring and is configured to move said coupling ring along an axis that is perpendicular to said surface of said edge ring to increase said gap.

3. The plasma processing system of claim 1 wherein said arrangement includes an actuator.

4. The plasma processing system of claim 3 wherein said actuator is a linear actuator.

5. The plasma processing system of claim 3 wherein said actuator is a screw actuator.

6. The plasma processing system of claim 1 wherein said capacitance value of said capacitance disposed along said capacitive path is decreased by a given value, said given value represents a capacitance value sufficient to offset a first increase in capacitance along said capacitive path, said first increase in capacitance being attributable to thinning damage of said edge ring.

7. The plasma processing system of claim 1 wherein said processing includes etching said substrate.

8. The plasma processing system of claim 1 wherein said processing includes depositing a layer of material on said substrate.

9. A plasma processing system having at least one plasma processing chamber for processing a plurality of substrates, said plasma processing chamber comprising:
   a chuck configured for supporting a substrate during said processing;
   an edge ring having an outer periphery, said outer periphery of said edge ring surrounding said chuck, wherein said edge ring is disposed alone a capacitive path between a plasma sheath and said chuck during said processing, said plasma sheath being associated with a plasma generated during said processing; and,
   an arrangement for adjusting a capacitance value of a capacitance disposed alone said capacitive path, wherein said capacitance represents a variable impedance device, said arrangement for adjusting said capacitance value of said capacitance includes an adjustment mechanism for adjusting a capacitance value of said variable impedance device.

10. A plasma processing system having at least one plasma processing chamber for processing a plurality of substrates, said plasma processing chamber comprising:
    supporting means for supporting a substrate during said processing;
    an edge ring having an outer periphery, said outer periphery of said edge ring surrounding said supporting means, wherein said edge ring is disposed along a capacitive path between a plasma sheath and said supporting means during said processing, said plasma sheath being associated with a plasma generated during said processing;
    a coupling ring disposed along said capacitive path; and,
    means for adjusting a capacitance value of a capacitance disposed along said capacitive path, said adjusting comprises moving, along an axis that is substantially perpendicular to a surface of said edge ring, one of said edge ring and said coupling ring to adjust a gap between adjacent surfaces, said adjacent surfaces including said surface of said edge ring and a surface of said coupling ring.

11. The plasma processing system of claim 10 wherein said means for adjusting is coupled to said coupling ring and is configured to move said coupling ring along an axis that is substantially perpendicular to said surface of said edge ring to increase said gap.

12. The plasma processing system of claim 10 wherein said means for adjusting is coupled to said coupling ring and is configured to move said coupling ring along an axis that is substantially perpendicular to said surface of said edge ring to decrease said gap.

13. The plasma processing system of claim 10 wherein said means for adjusting includes one of a linear actuator and a screw actuator.

14. The plasma processing system of claim 10 wherein said capacitance value of said capacitance disposed along said capacitive path is decreased by a given value, said given value represents a capacitance value sufficient to offset a first increase in capacitance along said capacitive path, said first increase in capacitance being attributable to thinning damage of said edge ring from said processing.

15. The plasma processing system of claim 10 wherein said capacitance value of said capacitance disposed along said capacitive path is increased by a given value, said given value represents a capacitance value sufficient to offset a first decrease in capacitance along said capacitive path, said first decrease in capacitance being attributable a build up of material on said edge ring from said processing.

* * * * *